(12) United States Patent
Joy et al.

(10) Patent No.: US 6,359,233 B1
(45) Date of Patent: Mar. 19, 2002

(54) PRINTED CIRCUIT BOARD MULTIPACK STRUCTURE HAVING INTERNAL GOLD FINGERS AND MULTIPACK AND PRINTED CIRCUIT BOARD FORMED THEREFROM, AND METHODS OF MANUFACTURE THEREOF

(75) Inventors: Steven C. Joy; Michael J. Lane, both of Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/426,758

(22) Filed: Oct. 26, 1999

(51) Int. Cl.$^7$ .............................. H05K 1/11; H05K 1/03
(52) U.S. Cl. ...................... 174/255; 174/250; 174/255; 174/256; 361/737; 361/739; 361/774; 361/779; 361/792; 428/901
(58) Field of Search ................................ 174/255, 261, 174/250, 256, 52.4, 253; 361/792, 760, 736, 737, 739, 774, 779, 803, 784, 790, 748, 767, 762; 428/209, 210, 901; 439/55; 29/830, 831, 842, 846, 847, 829, 825

(56) References Cited

U.S. PATENT DOCUMENTS

| | | | | |
|---|---|---|---|---|
| 4,949,155 A | * | 8/1990 | Tajima et al. ................ | 174/255 |
| 5,343,616 A | * | 9/1994 | Roberts ......................... | 29/846 |
| 5,484,963 A | * | 1/1996 | Washino ...................... | 174/261 |
| 5,847,930 A | * | 12/1998 | Kazle .......................... | 361/736 |
| 5,886,876 A | * | 3/1999 | Yamaguchi .................. | 361/767 |
| 5,953,216 A | * | 9/1999 | Farnworth et al. ........... | 361/777 |
| 6,022,466 A | * | 2/2000 | Tamarkin et al. ............ | 205/126 |
| 6,162,365 A | * | 12/2000 | Bhatt et al. .................... | 216/13 |
| 6,201,193 B1 | * | 3/2001 | Hashimoto ................... | 174/260 |

\* cited by examiner

Primary Examiner—Albert W. Paladini
Assistant Examiner—I B Patel
(74) Attorney, Agent, or Firm—Antonelli, Terry, Stout & Kraus, LLP

(57) ABSTRACT

Disclosed is a printed circuit board multipack, having a plurality of printed circuit boards (for example, a plurality of PCI compliant cards) provided using a common web of substrate material for a printed circuit board. Also disclosed is printed circuit board multipack structure, from which the multipack is formed, and individual printed circuit boards formed from the multipack, and methods of manufacture of each. Printed circuit board structures of the multipack have an internal edge, spaced from the periphery of the web, that is bevelled, and have conductive fingers, e.g., with an electrodeposited gold uppermost layer, extending to the internal edge. The multipack structure includes a common bus bar running adjacent the inner boundary of the printed circuit board structures, and conductive extensions from a conductive base layer of the conductive fingers to the bus bar. Due to the conductive extensions and common bus bar, electrode-position of the gold for the conductive fingers can easily be performed. In forming the multipack from the multipack structure, the structure is bevelled at the inner boundary, using a circular bevelling blade, to both provide the bevelled inner edge and remove the common bus bar and conductive extensions. The bevelling thins the web at the inner edge. The printed circuit boards are separated by snapping an individual printed circuit board apart from a remainder of the web, at the thinned portion of the web.

23 Claims, 4 Drawing Sheets

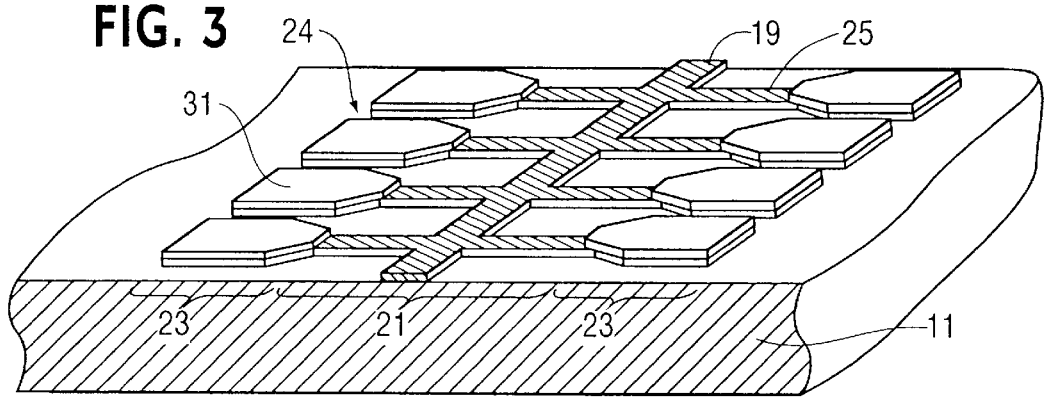
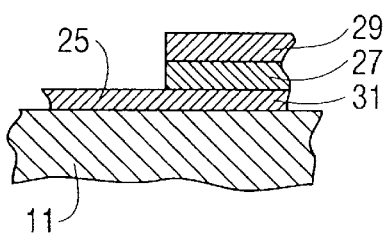
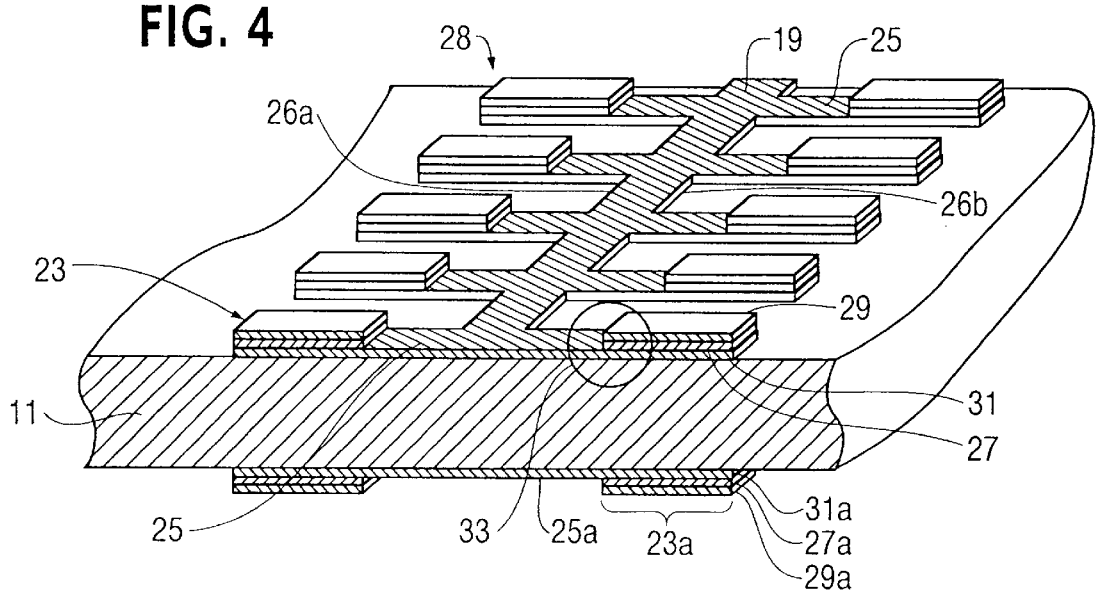

PRINTED CIRCUIT BOARD MULTIPACK STRUCTURE HAVING INTERNAL GOLD FINGERS AND MULTIPACK AND PRINTED CIRCUIT BOARD FORMED THEREFROM, AND METHODS OF MANUFACTURE THEREOF

FIELD

The present invention is directed to a printed circuit board multipack having internal gold fingers, formed from a printed circuit board multipack structure, and printed circuit boards made therefrom, and methods of manufacture thereof.

BACKGROUND

Currently, printed circuit boards are manufactured in multipacks, having a plurality of printed circuit boards formed occupying a single web of material of a printed circuit board substrate. For example, a plurality of rows of printed circuit board structures are provided occupying a web of material of a printed circuit board substrate (e.g., a single, integral web of reinforced plastic material).

In various types of printed circuit boards, gold fingers extend to an edge of the printed circuit board. With multipacks of such printed circuit boards having such gold fingers, the current state of the art requires that all gold fingers be designed along the periphery of the multipack. This is due to the present procedures to cut and bevel each printed circuit board. Currently, the multipacks are cut to size at the end of the printed circuit board manufacturing operation, and then bevelled using a fixed v-style blade or a single-sided routing machine that bevels one side at a time.

Types of boards which include gold fingers extending to an edge of the printed circuit board include cards that comply with the peripheral component interconnect (PCI) bus specification, the latest version of which is "PCI Local Bus Specification, Revision 2.1", set forth by the PCI Special Interest Group (SIG) on Jun. 1, 1995. Hereinafter, such cards in compliance with the PCI Local Bus Specification (that can be electrically connected to PCI busses complying with the PCI Bus Specification) are called PCI, or peripheral component interconnect, compliant cards. These peripheral component interconnect compliant cards have a bevelled edge to facilitate insertion (engagement) of the PCI compliant cards with slots therefor in, e.g., a modern computer system such as a server, workstation or personal computer. The specification for the bevelled edge of the PCI compliant card includes a bevelled edge length of 70/1000 inch and an angle of 20° with respect to a line through the PCI compliant card and passing through the end of the bevel, and parallel to the major surfaces of the PCI compliant card.

Present printed circuit board multipacks, having the gold fingers extending to the periphery (that is, external gold fingers), have disadvantages. For example, the number of printed circuit boards which can be provided on a single web of material of the printed circuit board substrate is limited, in that the gold fingers must extend at the periphery of the web. Moreover, speed of manufacturing printed circuit boards, with such relatively limited number of printed circuit boards on a single web, is disadvantageously low. Due thereto, costs of manufacturing the printed circuit boards are relatively high.

SUMMARY

The present invention, in various embodiments, includes a printed circuit board multipack. The multipack includes a web of material of a printed circuit board substrate, the web having a periphery. The multipack includes at least a first printed circuit board structure, including a first region of the web. The first printed circuit board structure has an internal edge spaced from the periphery of the web. The first printed circuit board structure includes electrically conductive fingers which extend in a direction toward the internal edge of the printed circuit board structure and terminate adjacent thereto.

BRIEF DESCRIPTION OF THE DRAWINGS

FIG. 3 is a perspective view of structure, at a stage in the manufacture of a printed circuit board multipack, having copper land areas for electrical connection during electroplating, according to an example and illustrative embodiment of the present invention.

FIG. 4 is a perspective view of a printed circuit board multipack structure having electrically conductive fingers according to an example and illustrative embodiment of the present invention, utilizing a laminate of layers for the electrically conductive fingers.

FIG. 5 is a more detailed view of the laminate of layers of conductive materials for the electrically conductive fingers, according to an example and illustrative embodiment of the present invention.

DETAILED DESCRIPTION

Figure 1:
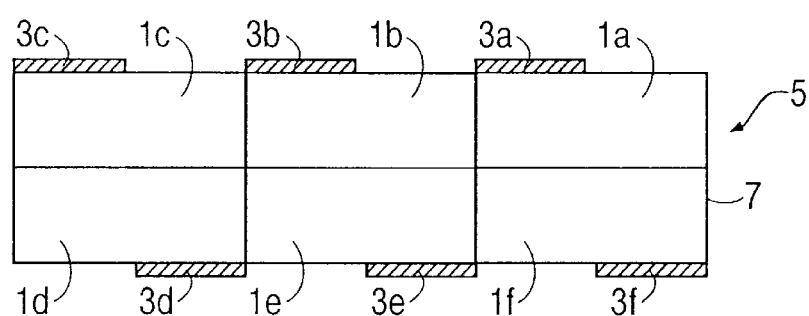
FIG. 1 Schematically shows current printed circuit board multipacks, having external gold fingers only.

While the invention will be described in connection with specific examples and illustrative embodiments, it will be understood that it is not intended to limit the invention to those examples and illustrative embodiments. To the contrary, it is intended to cover all alterations, modifications, and equivalents as may be included within the spirit and scope of the invention as defined by the appended claims.

Examples and illustrative embodiments of the present invention, in the following, are described in connection with the various drawing figures. Components, in the various drawing figures, having corresponding functions are referred to using common reference numerals.

FIG. 1 schematically shows printed circuit board multipack 5 currently being used. This FIG. 1 shows printed circuit board structures 1a, 1b, 1c, 1d, 1e and 1f, having gold fingers at locations or areas 3a, 3b, 3c, 3d, 3e and 3f, respectively. The gold fingers are not shown per se in FIG. 1, but would be fingers extending, e.g., perpendicular to the longer sides of locations 3a, 3b, etc., as suitable in the art. As can be appreciated from FIG. 1, all of the areas 3a, 3b, 3c, 3d, 3e and 3f for the gold fingers are at the periphery of web 7 (of material for the printed circuit board substrate) of printed circuit board multipack 5. Due to the locations 3a, . . . 3f being at the periphery of web 7, the number of rows of printed circuit board structures 1a–1f of printed circuit board multipack 5 is limited (e.g., to two rows, to provide respective external areas 3a, . . . 3f at the periphery of web 7).

Figure 2:
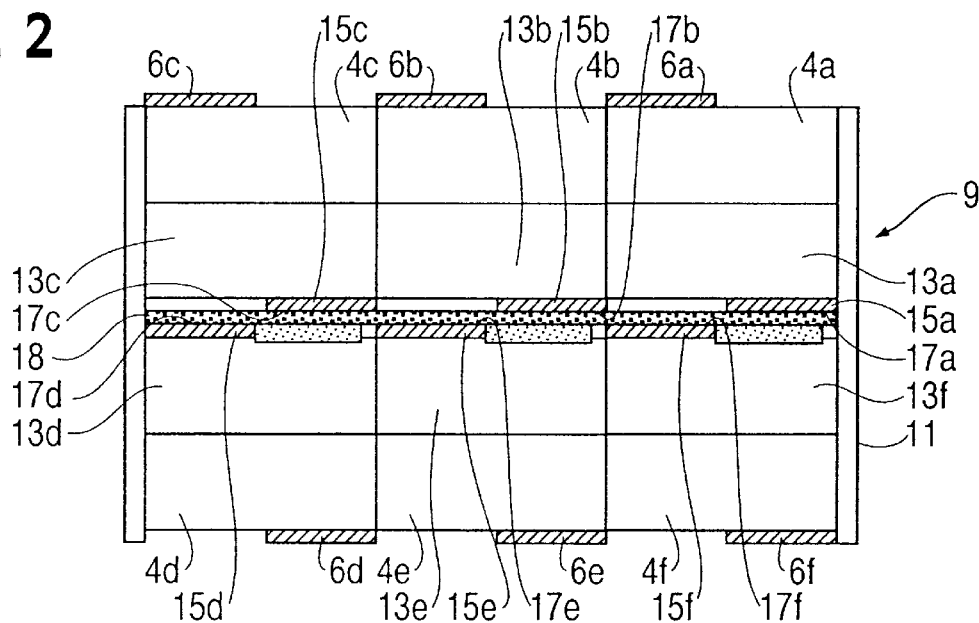
FIG. 2 schematically shows an example of a printed circuit board multipack, having internal conductive fingers, as an example and illustrative embodiment of the present invention.

An example and illustrative embodiment according to the present invention is shown in FIG. 2. Printed circuit board multipack 9 of FIG. 2 includes web 11 of material of the substrates of the printed circuit boards; and printed circuit board structures 4a, 4b, 4c, 4d, 4e and 4f respectively with locations 6a, 6b, 6c, 6d, 6e and 6f having conductive fingers, similar to that shown in FIG. 1 (that is, having conductive fingers extending at the periphery of web 11). Each printed circuit board structure 4a, 4b, 4c, etc., includes a respective region of web 11 (which region becomes the printed circuit board substrate of the respective produced printed circuit board). Moreover, multipack 9 of FIG. 2 includes additional printed circuit board structures 13a, 13b, 13c, 13d, 13e and 13f with internal locations or areas 15a, 15b, 15c, 15d, 15e and 15f, respectively, having conductive fingers thereon. Each of additional printed circuit board structures 13a –13f also includes a respective region of web 11.

Thus, multipack 9 according to the present invention can have more than two rows of printed circuit board structures (e.g., more than the two rows which is the limit with only external gold fingers as in FIG. 1). For example, and not to be limiting, multipack 9 can have two additional rows of printed circuit board structures, as shown in FIG. 2, which has the two additional rows of printed circuit board structures 13a–13c and 13d–13f. These two additional rows of printed circuit board structures 13a–13c and 13d–13f have conductive fingers extending to internal edges 17a, 17b, 17c, 17d, 17e and 17f, respectively, of printed circuit board structures 13a, 13b, 13c, 13d, 13e and 13f. The conductive fingers (not individually shown in FIG. 2) of printed circuit board structures 13a–13f, on the internal areas 15a–15f, respectively, extend to internal edges 17a–17f, for example, the conductive fingers extending perpendicular to the internal edges, these internal edges 17a–17f forming respective internal edges of the printed circuit board structures 13a 13f.

As can be appreciated from FIG. 2, the internal edges 17a, 17b, and 17c form edges of the respective printed circuit board structures 13a–13c, respectively, that are closest to the internal edges 17d–17f respectively of printed circuit board structures 13d–13f. A spacing region 18 of web 11 is provided between internal edges 17a–c, on the one hand, and internal edges 17d–17f, on the other. Spacing region 18 of web 11 is thinner than regions of web 11 included as part of printed circuit board structures 13a, 13b, 13c, etc. Desirably, web 11 at spacing region 18 decreases from internal edges 17a–17c and 17d–f, to a midpoint between internal edges 17a–17c and 17d–f. The resulting structure provides a bevelled edge for each of the printed circuit structures 13a 13f, the face of the bevelled edge extending from each of internal edges 17a–17f to the aforementioned midpoint.

Preferably, web 11 decreases gradually (for example, linearly and uniformly) in thickness from internal edges 17a–17c and 17d–17f to the aforementioned midpoint, in providing the bevelled surface (that is, the bevelled internal edge).

FIG. 2 shows multipack 9 having printed circuit board structures with external conductive fingers and printed circuit board structures with internal conductive fingers. It is within the contemplation of the present invention to provide multipacks having all printed circuit board structures with internal conductive fingers.

FIG. 3 shows structure at a step of manufacturing the printed circuit board multipack according to an example and illustrative embodiment of the present invention. In the structure of FIG. 3, which is at a stage of manufacture of the multipack prior to forming the multipack structure, shown are web 11, of material of the substrate of the printed circuit boards, having thereon copper layer 24 selectively provided on a main surface (or, in another embodiment, on both opposed main surfaces) of web 11. Copper layer 24 can be an electrolessly deposited layer, formed by suitable techniques. Alternatively, copper layer 24 can be formed by adhering a copper foil to web 11, e.g., by suitable techniques, and selectively etching the copper foil to form copper layer 24. Copper layer 24 provides copper land areas 21, which are bus bar 19 and copper extensions 25 to bus bar 19, of the printed circuit board multipack structure according to an example and illustrative embodiment of the present invention. Copper layer 24 also forms copper base 31 for conductive finger areas 23 for individual conductive fingers 38 (see FIG. 6).

The structure of FIG. 3 shows copper layer 24 used for electrical connection in providing conductive finger areas 23 with, e.g., a layer of electrolytically deposited gold. Bus bar 19 and copper extensions 25 facilitate application of electrical current to the plurality of conductive finger areas 23, for the electrodeposition. FIG. 3 shows conductive finger areas 23, and bus bar 19 and copper extensions 25, for printed circuit board structures facing each other on web 11 (e.g., corresponding to facing printed circuit board structures 13a and 13f in FIG. 2). As can be appreciated, not shown in FIG. 3 is other wiring, for example, which can be formed of a same copper layer from which bus bar 19, copper extensions 25 and copper base 31 are formed, of each printed circuit board structure.

FIG. 4 shows printed circuit board multipack structure 28 according to an example and illustrative embodiment of the present invention. Multipack structure 28 includes bus bar 19 and copper extensions 25 to bus bar 19, and gold layer 29 on conductive finger areas 23. In FIG. 4 is shown a laminate structure of the conductive fingers at conductive finger areas 23. The laminate construction is shown in more detail in FIG. 5, which shows structure within circle 33 of FIG.4. Thus, at each conductive finger area 23 is provided copper base 31 adjacent web 11, nickel layer 27 on copper base 31, and gold layer 29 on nickel layer 27. This laminate structure is preferred. Nickel layer 27 is used in a preferred embodiment, in order to provide greater adherence of gold layer 29 to web 11, via copper base 31.

As discussed previously, according to one aspect and illustrative embodiment of the present invention, the conductive fingers of the individual printed circuit board formed from the multipack are brought into electrical connection with contacts in a slot by inserting an edge of the card into the slot. For example, PCI compliant cards are inserted into slots in, e.g., a modern computer system to provide electrical contact. Gold layer 29 is a good lubricant for, e.g., the conductive fingers acting as connectors, to be inserted into the slot, and is a good conductor, but is very expensive. Accordingly, it is desired to minimize the amount of gold utilized. Thus, while a gold layer 29 of at least 30millionths of an inch is preferable, it is desired to make the thickness of gold layer 29 as thin as possible.

Bus bar 19 is provided on a spacing region of web 11, between a printed circuit board structure containing conductive fingers to the left of bus bar 19, and another printed circuit board structure to the right of bus bar 19, in FIG. 4. Boundaries 26a and 26b are provided respectively between (1) the region of web 11 which is included as part of the printed circuit board structure to the left of bus bar 19 and (2) the spacing region of web 11 on which bus bar 19 is provided; and between (3) the region of web 11 which is included as part of the printed circuit board structure to the right of bus bar 19 and (4) the spacing region of web 11 on which bus bar 19 is provided.

As can be seen in each of FIGS. 3 and 4, copper extensions 25 to bus bar 19, bus bar 19 and copper base 31 can all be formed of a single copper layer provided on the surface of web 11. For example, a layer of copper foil can be provided on the surface of web 11, and then etched to form, inter alia, copper base 31 and copper extension 25 and bus bar 19. Alternatively, the copper can be selectively deposited on the substrate utilizing suitable deposition techniques (e.g., electroless deposition), to form copper base 31, copper extensions 25 and bus bar 19, as a unitary structure, simultaneously on the surface of web 11.

Of course, and while not shown, the surface of web 11, for each printed circuit board structure (for example, each of structures 4a–4f and 13a–13f in FIG. 2) has additional wiring (circuitry) thereon, formed utilizing suitable techniques, and the finally formed printed circuit board will also include components such as transistors, e.g., soldered to the circuitry on the web (board substrate), as is suitable in the art.

FIG. 4 shows printed circuit board multipack structure 28, including bus bar 19 and copper extensions 25 to bus bar 19. Through use of copper extensions 25 to bus bar 19, electrolytic deposition (electroplating) of conductive metal, such as gold, on conductive finger areas 23 is facilitated, prior to forming the multipack and then splitting up the multipack into individual printed circuit boards (that is, singulating the printed circuit board multipack).

FIG. 4 shows conductive finger areas, and copper extensions and a bus bar, provided on each of both opposed main surfaces of web 11. Thus, it is within the contemplation of the present invention that wiring structure and conductive fingers are provided on either one side, or on both sides, of web 11. FIG. 4 shows, on the opposed side of web 11 to the upper side, copper base 31a, nickel layer 27a and gold layer 29a, forming a laminate which provides the conductive fingers on conductive finger area 23a, and also shows copper extensions 25a to the bus bar on the lower surface of web 11. While the bus bar is not shown on the lower surface of web 11, such bus bar would be on the lower surface, and be beneath and run parallel to bus bar 19 shown on the upper surface of web 11 in FIG. 4. Through-holes (not shown) can be provided through web 11 to provide electrical connection between wirings on both of the opposed sides of the printed circuit board; and/or the printed circuit board can be a multilayer circuit board, with interior wiring and through-holes providing electrical connection thereto and therebetween.

In the structure as shown in FIG. 4, through use of bus bar 19 electrodeposition can be used to deposit a highly conductive metal (e.g., gold, but not limited to gold) on desired wiring structure (for example, on copper base 31 at the conductive finger areas 23), e.g., simultaneously on all printed circuit board structures, prior to snapping apart the individual printed circuit boards.

Figure 6:
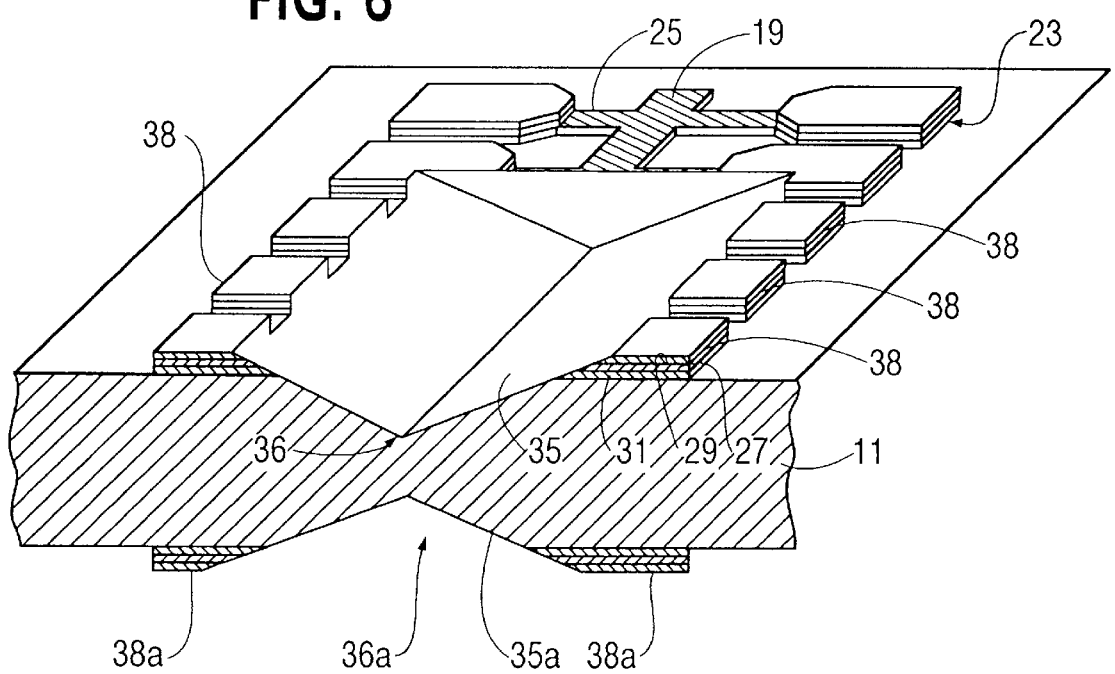
FIG. 6 is a perspective view of printed circuit board multipack structure according to an example and illustrative embodiment of the present invention, wherein a part of the web material and overlying bus bar and electrical connection structure has been ground away.

FIG. 6 shows beveling to form the bevelled internal edges of the printed circuit board structures, in forming printed circuit board multipack 9. As shown in FIG. 6, grooves 36, 36a are formed, providing abraded surfaces 35, 35a of web 11. These abraded surfaces 35, 35a are exposed when beveling to form the bevelled internal edge. Thus, the spacing region is ground away or cut, in the beveling, to form the bevelled internal edge. As can be appreciated from FIG. 6, in beveling to form the bevelled internal edges the beveling blade grinds away (routs off) both bus bar 19 and copper extensions 25, thus electrically isolating each of the conductive fingers 38, 38a at each of the conductive finger areas 23. After isolating each of the printed circuit boards electrically, the supplier can test the individual printed circuit boards (respective conductive fingers 38, 38a) while still part of the multipack.

As can be seen in FIG. 6, in grinding away bus bar 19 and conductive extensions 25, small portions of the conductive fingers, including small portions of gold layer 29, are also ground off. Amount of the gold of gold layer 29 which is removed should be minimized, in view of the expense of the gold. As seen in FIG. 6, the beveling is provided at both sides of web 11. This provides a taper to the edge of each individual printed circuit board, to which the conductive fingers extend, after the individual printed circuit boards have been separated from each other, which can facilitate insertion of the printed circuit board into a connector. In this regard, under the aforementioned PCI Local Bus Specification, Revision 2.1, the lower edges of PCI compliant cards are to be bevelled to a 20° angle, the bevelled portion being 0.070 inches in length. By the present beveling, such bevelled edge can easily be achieved.

In forming bevelled surfaces 35, 35a (that is, forming groove 36, 36a in web 11, to form the bevelled edge), the grinding preferably is not performed through an entire thickness of web 11. That is, grooves 36, 36a only extend partly through the thickness of web 11. Thus, multipack 9 having a plurality of printed circuit board structures can be maintained intact, for further processing (for example, electrical testing). The individual printed circuit boards need not be snapped apart until desired, at the end of, e.g., common processing procedures for a group of the printed circuit board structures.

In grinding away copper extensions 25, bus bar 19 and web 11, in forming grooves 36, 36a according to the present invention, the conductive fingers are isolated simultaneously with providing the bevelled edge. Thus, both functions can be performed at the same time.

While, in FIG. 6, a single groove 36 is shown at one side of web 11 which, upon completion thereof, would extend the entire length of web 11, groove 36 need not extend the entire length of the web. For example, areas along the length can be maintained without a ground (cut) portion, so as to maintain a greater rigidity and strength of multipack 9, and ensure integrity of multipack 9 prior to snapping apart the individual boards. Of course, the groove should be sufficient that the individual boards can be snapped apart properly when desired.

Figure 7:
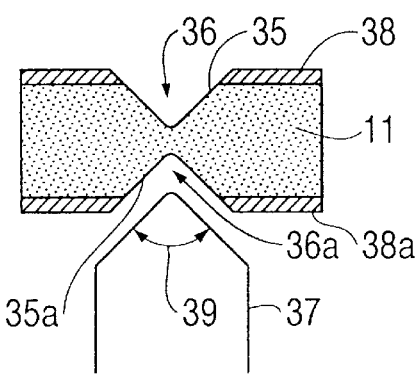
FIG. 7 is a schematic cross-sectional view of a printed circuit board multipack showing web material ground away at both main sides of the web.
Figure 8:
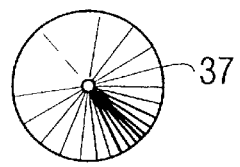
FIG. 8 is a side view of a circular beveling blade, according to an example and illustrative embodiment of the present invention.

The beveling blade and beveling technique, for forming grooves 36, 36a, are shown schematically in FIGS. 7 and 8.

Shown in FIGS. 7 and 8 is circular beveling blade 37. Beveling blade 37 has a circumferential cutting surface, e.g., an abrasive circumference. The circumferential cutting surface can, e.g., be a carbide cutting surface or include exposed diamond bits, for grinding or cutting bus bar 19/copper extension 25/web 11 in forming grooves 36, 36a. In forming PCI compliant cards, the circumferential cutting surface of blade 37 has a configuration that forms angle 39 which is 140°. Using this blade, a single cutting step along the length of web 11 can be used, to form groove 36 at one side of the web, so as to provide the bevelled internal edge of each individual PCI compliant card with a proper angle and length.

The blade having the 140° angle is appropriate in forming PCI compliant cards, in view of the aforementioned PCI bus standard. Of course, the angle and length of the groove (and correspondingly, the configuration, e.g., angle, of the cutting surface of circular beveling blade 37) can be selected to form any predetermined bevelled edge, e.g., for other types of printed circuit boards.

Figure 9:
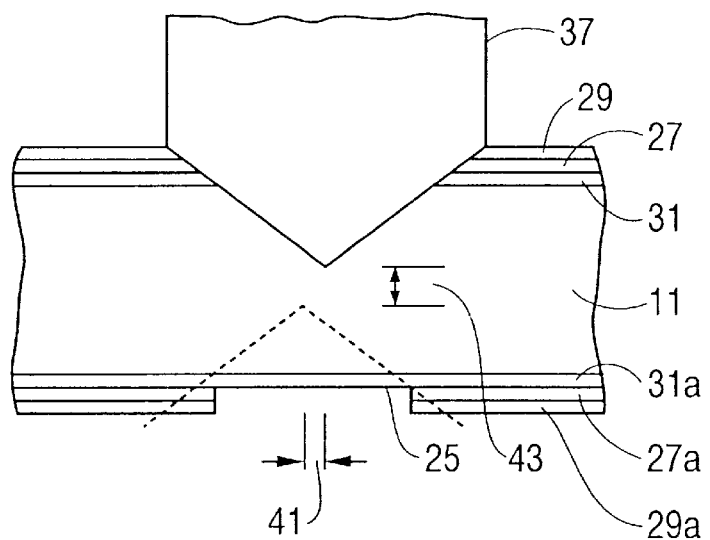
FIG. 9 is a schematic cross-sectional view of a first technique for forming the printed circuit board multipack from the multipack structure, according to an example and illustrative embodiment of the present invention, wherein opposing sides of the printed circuit board multipack structure are sequentially ground.

FIG. 7 shows use of a single circular beveling blade 37, with grooves 36, 36a, having abraded surfaces 35, 35a, respectively being formed at the opposite sides of web 11. Circular beveling blade 37 rotates to grind(cut) and moves along web 11, to form groove 36. When using a singular circular beveling blade 37, two passes are necessary for respectively forming grooves 36, 36a at both sides of web 11. That is, initially, circular beveling blade 37 passes along one side of web 11, forming groove 36 in this one side. Thereafter, web 11 is turned over, and in a second pass groove 36a is formed at the opposed side of web 11. However, use of the single circular beveling blade 37 provides the potential of misalignment, as shown in FIG. 9. That is, when the board is flipped over, during a second pass there may be misalignment 41 between the grooves formed.

Figure 10:
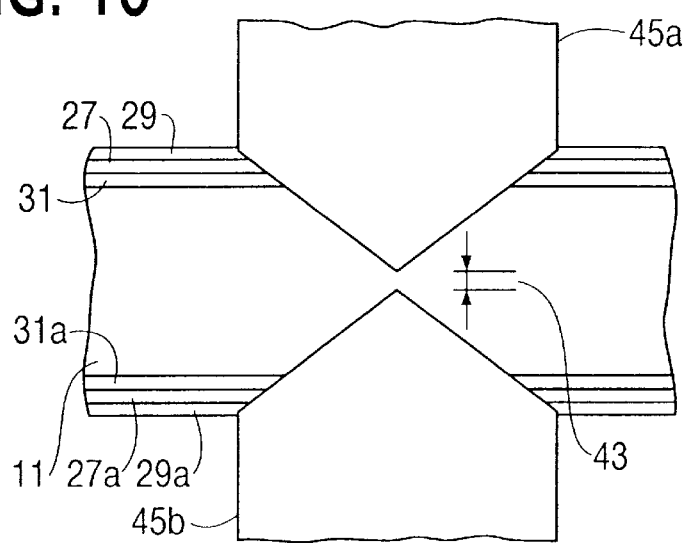
FIG. 10 is a schematic cross-sectional view of another example and illustrative embodiment of the present invention for forming the printed circuit board multipack from the multipack structure, according to an example and illustrative embodiment of the present invention, wherein both sides of the multipack structure are simultaneously ground.

This problem of misalignment can be avoided utilizing dual opposing circular beveling blades 45a, 45b, as shown in FIG. 10. That is, in FIG. 10 are two circular beveling blades 45a, 45b. Utilizing these two blades, beveling can be provided simultaneously at both opposed sides of web 11, substantially without misalignment.

Shown in each of FIGS. 9 and 10 is uncut web portion 43, remaining after forming grooves at both sides of web 11. By maintaining uncut web portion 43, structural integrity and rigidity of the multipack can be maintained, yet the individual printed circuit boards can be snapped apart from each other at the appropriate time.

The printed circuit board multipack structure, printed circuit board multipack and printed circuit board formed therefrom, can be fabricated by the following aspect and illustrative example according to the present invention.

Initially appropriate wiring structure (of a first conductive material, e.g., a metal such as copper) is provided on main surfaces of web 11. Such copper wiring structure could include copper base 31 on conductive finger areas 23 for conductive fingers 38, as well as, preferably, copper extensions 25 and bus bar 19. Such copper wiring structure can be provided on one side, or preferably on both sides, of web 11. The copper can be provided by an additive procedure (e.g., electroless plating), or by a subtractive procedure of, e.g., providing a copper foil on web 11 and selectively etching the copper foil to provide the desired wiring structure, as suitable in the art. Also, through-holes, through web 11, can be provided, and conducting material provided in the through-holes, as suitable in the art.

Then, conductive areas (e.g., the through-holes) which are not to be electrodeposited are masked, as suitable in the art.

Thereafter, a second conductive material, e.g., a metal such as nickel, and then a third conductive material, e.g., a metal such as gold, can each be selectively electrodeposited, on unmasked portions of the copper wiring structure, e.g., at least at the conductive finger areas 23, to provide, e.g., nickel layer 27 and gold layer 29. The board substrate can be conveyed through a nickel electroplating bath, and then through a gold electroplating bath, to perform the electrodeposition, as is suitable in the art, after appropriate taping of portions of the copper wiring structure that are not to be deposited with the nickel and gold, as mentioned previously.

Illustratively, and not to be limiting, the gold plating bath in which the deposition takes place is about 7 inches deep, to minimize the use of gold. By the present invention, web 11 can be about 8 inches in height, in order to provide a preferred number of rows of printed circuit boards in the height direction of web 11. The gold and nickel can be electrodeposited on web 11 from the 7 inch deep bath, notwithstanding use of webs 11 having an 8 inch height. That is, the web is passed through the bath, so that, for example, the top one inch of the web sticks out of the plating bath. Thereafter, the web is re-taped and flipped over, and then passed a second time through the electrodeposition bath. By this technique, the entire web can be electrodeposited, notwithstanding that the web has a greater height than the height of the bath.

After the electrodeposition, a printed circuit board multipack structure is provided, a portion of which is shown in, for example, FIG. 4. Thereafter, grooves 36 are provided, utilizing circular bevelling blades, as discussed previously.

The grinding to form grooves 36 may result in debris (e.g., dirt or dust) remaining on printed circuit board multipack 9. Accordingly, after grinding grooves 36 and/or 36a, it may be desired to wash the web to remove such debris. Otherwise, when soldering components on the printed circuit board, such soldering to provide electrical connection may be compromised or weakened due to the remaining debris.

Whether or not washing is performed, web 11 can be broken apart, at groove 36, to form individual printed circuit boards from multipack 9 (that is, multipack 9 can be singulated).

The breaking of the web may result in a jagged edge. If such jagged edge would have an effect on operation of the printed circuit board, for example, have an effect on electrical connection upon insertion of a PCI compliant card into contact with connectors therefor, or have an effect on the connector pins of the connectors, the jagged edge may be further treated, for example, by sanding or grinding, to provide a more pointed and/or smoother end for the bevelled edge. For example, a piece of sandpaper can be utilized, to smooth the rough edges so as to avoid bad effects caused by a rough edge.

Printed circuit boards (such as PCI compliant cards) formed according to aspects of the present invention can be used as conventional printed circuit boards are used, and can be assembled into electrical devices utilizing existing manufacturing processes.

While the various aspects of the present invention have been described primarily in connection with PCI compliant cards, the present invention is not limited thereto. Generally, the present invention is directed to printed circuit boards, including multilayer printed circuit boards, utilizing a bevelled edge and conductive fingers extending thereto, e.g., for insertion to electrical connectors.

Various materials are known for use as web material for printed circuit board substrates, and can be utilized according to various aspects and illustrative examples of the present invention.

The various aspects and illustrative examples of the present invention, as described in the foregoing, utilize a single internal groove 36, 36', on respective opposed sides of web 11 for printed circuit board multipack 9. However, the present invention is not limited to use of a single groove on each side. That is, additional rows of printed circuit board structures can be provided on web 11, with additional grooves between adjacent rows. Limitation as to the number of rows is based on strength of the grooved web. That is, the number of grooves should not be so great so as to weaken multipack 9 such that it would collapse of its own weight.

A practical limit on the size of printed circuit board multipack 9 is the size of the web that can be handled by printed circuit board processing equipment.

Various aspects and illustrative embodiments of the present invention have been described in connection with gold finger patterns, of a laminate conductive finger structure including a nickel intermediate layer and copper base adjacent the substrate. However, the present invention is not limited to the laminate structure, or to use of the specific metals, being applicable in general to the use of conductive fingers extending to an edge of the printed circuit board.

According to various aspects and illustrative embodiments of the present invention, line speed in manufacturing the multipacks can be increased up to 80%. In addition, through use of the internal fingers, the number of rows of printed circuit board structures provided on the multipack can be increased. Thus, increased speed of manufacture of printed circuit boards, with decreased cost thereof, can be achieved.

While there have been shown and described several examples and illustrative embodiments in accordance with the present invention, it is understood that the same is not limited thereto, but is susceptible of numerous changes and modifications as known to those skilled in the art. Therefore, the invention is not limited to the details shown and described herein, but is intended to cover all such changes and modifications as are encompassed by the scope of the appended claims, including equivalents thereof.

What is claimed is:

1. A printed circuit board multipack, comprising:
   a web of material of a printed circuit board substrate, the web having a periphery; and
   at least a first printed circuit board structure, including a first region of said web, the first printed circuit board structure having an internal edge spaced from the periphery of the web, wherein the first printed circuit board structure includes electrically conductive fingers which extend in a direction toward said internal edge and terminate at said internal edge.

2. The printed circuit board multipack according to claim 1, further comprising at least a second printed circuit board structure, including a second region of the web, the second printed circuit board structure having an internal edge spaced from the periphery of the web, wherein the second printed circuit board structure includes electrically conductive fingers which extend in a direction toward the internal edge of the second printed circuit board structure and terminate at said internal edge.

3. The printed circuit board multipack according to claim 2, wherein the internal edge of the first printed circuit board structure is the edge of the first printed circuit board structure closest to the internal edge of the second printed circuit board structure, the internal edge of the first printed circuit board structure being spaced from the internal edge of the second printed circuit board structure by a spacing region; wherein the web has a first thickness, at the first and second regions; and wherein at said spacing region, a thickness of the web is less than said first thickness.

4. The printed circuit board multipack according to claim 3, wherein the thickness of the web at the spacing region decreases from the internal edges of each of the first and second printed circuit board structures to a midpoint between the internal edges of the first and second printed circuit board structures.

5. The printed circuit board multipack according to claim 3, wherein the first and second printed circuit board structures are first and second peripheral component interconnect compliant card structures, respectively.

6. The printed circuit board multipack according to claim 5, wherein the thickness of the web at the spacing region is less than the thickness of the web at the first and second regions, so as to form a bevel at the internal edges of each of the first and second peripheral component interconnect compliant card structures.

7. The printed circuit board multipack according to claim 1, wherein the electrically conductive fingers include a gold layer.

8. The printed circuit board multipack according to claim 7, wherein the electrically conductive fingers include a laminate of a copper layer adjacent the web, a gold outer layer, and a nickel layer between the gold outer layer and the copper layer.

9. The printed circuit board multipack according to claim 1, wherein the web is a unitary member, and wherein the printed circuit board multipack includes a plurality of printed circuit board structures, each respective printed circuit board structure, of the plurality of printed circuit board structures, having conductive fingers which extend in a direction toward an internal edge of the respective printed circuit board structure and terminate at the internal edge of the respective printed circuit board structure, the internal edge of each respective printed circuit board structure being spaced from the periphery of the web.

10. The printed circuit board multipack according to claim 9, wherein the web extends in a height direction and a length direction; and wherein the plurality of printed circuit board structures are provided in at least three rows, each row extending in the length direction, and the rows being spaced from each other in the height direction.

11. The printed circuit board multipack according to claim 1, wherein the first printed circuit board structure is a peripheral component interconnect compliant card structure, having the internal edge.

12. The printed circuit board multipack according to claim 11, wherein the internal edge of the peripheral component interconnect compliant card structure is bevelled.

13. The printed circuit board multipack according to claim 1, wherein said material of the web is a reinforced plastic material.

14. The printed circuit board multipack according to claim 1, wherein the first printed circuit board structure additionally includes wiring provided on the first region of the web.

15. The printed circuit board multipack according to claim 1, wherein all of the electrically conductive fingers of the first printed circuit board structure terminate at said internal edge.

16. A printed circuit board multipack structure, comprising:
- a web of material of a printed circuit board substrate, the web having a periphery;
- at least a first printed circuit board structure, which first printed circuit board structure includes a first region of the web;
- a spacing region of the printed circuit board substrate adjacent the first region; and
- an electrically conductive bus bar extending on the spacing region,
    - wherein a first boundary is formed between the first region and the spacing region, the first boundary being spaced from the periphery of the web, and
    - wherein the first printed circuit board structure includes electrically conductive fingers, extending from the first region to the first boundary and having electrically conductive extensions which are electrically connected from the electrically conductive fingers to the bus bar.

17. The printed circuit board multipack structure according to claim 16, further comprising a second printed circuit board structure, which second printed circuit board structure includes a second region of the web, the second region forming a second boundary with the spacing region, the second boundary being spaced from the periphery of the web, the second boundary being spaced from the first boundary by the spacing region, the second printed circuit board structure having electrically conductive fingers extending to the second boundary, the electrically conductive fingers of the second printed circuit board structure having electrically conductive extensions which extend from the electrically conductive fingers of the second printed circuit board structure to be in electrical contact with said bus bar.

18. The printed circuit board multipack structure according to claim 16, wherein the electrically conductive fingers are a laminate of a copper layer adjacent the web, a gold outer layer, and a nickel layer between the copper layer and the gold outer layer, and wherein the electrically conductive extensions and the bus bar are of copper.

19. The printed circuit board multipack structure according to claim 18, wherein the copper layer, the electrically conductive extensions and the bus bar are integral and made from a same copper layer.

20. The printed circuit board multipack structure according to claim 16, wherein said material of the web is a reinforced plastic material.

21. The printed circuit board multipack structure according to claim 16, wherein the first printed circuit board structure additionally includes wiring provided on the first region of the web.

22. The printed circuit board multipack structure according to claim 16, wherein the bus bar, electrically conductive fingers, and electrically conductive extensions are a unitary structure.

23. The printed circuit board multipack according to claim 16, wherein all of the electrically conductive fingers of the first printed circuit board structure extend from the first region to the first boundary.

* * * * *